United States Patent
Boehm et al.

(10) Patent No.: US 10,197,452 B2
(45) Date of Patent: Feb. 5, 2019

(54) DETERMINING A TEMPERATURE

(71) Applicant: Infineon Technologies AG, Neubiberg (DE)

(72) Inventors: Christoph Boehm, Graz (AT); Maximilian Hofer, Hartberg (AT); Robert Kolm, Graz (AT)

(73) Assignee: Infineon Technologies AG, Neubiberg (DE)

( * ) Notice: Subject to any disclaimer, the term of this patent is extended or adjusted under 35 U.S.C. 154(b) by 531 days.

(21) Appl. No.: 14/920,857

(22) Filed: Oct. 22, 2015

(65) Prior Publication Data

US 2016/0116344 A1 Apr. 28, 2016

(30) Foreign Application Priority Data

Oct. 22, 2014 (DE) .................. 10 2014 115 394

(51) Int. Cl.
*G01K 7/01* (2006.01)
*H03K 3/356* (2006.01)
*H03K 3/037* (2006.01)

(52) U.S. Cl.
CPC ............... *G01K 7/01* (2013.01); *H03K 3/037* (2013.01); *H03K 3/356104* (2013.01)

(58) Field of Classification Search
CPC .. G01K 7/36; G01K 7/38; G01K 7/00; G01K 7/01; G01K 7/021; G01R 33/1223
USPC ........................................................ 374/178
See application file for complete search history.

(56) References Cited

U.S. PATENT DOCUMENTS

| | | | | |
|---|---|---|---|---|
| 3,387,527 | A * | 6/1968 | Schrecongost | G10H 5/07 331/113 R |
| 4,019,070 | A * | 4/1977 | Sakaguchi | H03K 3/356008 327/143 |
| 4,064,846 | A * | 12/1977 | Latsch | F02D 41/1408 123/406.23 |
| 4,912,392 | A * | 3/1990 | Faulkner | G01R 31/3648 320/132 |
| 6,255,876 | B1 * | 7/2001 | Chen | G11B 20/1426 327/170 |
| 7,331,708 | B2 | 2/2008 | Blom et al. | |
| 8,083,404 | B2 * | 12/2011 | Shoda | G01K 7/346 374/170 |
| 9,660,658 | B2 * | 5/2017 | Kolm | G11C 11/412 |
| 2005/0099375 | A1 * | 5/2005 | Moriyama | G09G 3/20 345/98 |
| 2007/0236265 | A1 * | 10/2007 | Maeda | H03K 17/22 327/143 |
| 2008/0297228 | A1 | 12/2008 | Kim | |
| 2011/0038396 | A1 | 2/2011 | Yi et al. | |
| 2012/0306553 | A1 | 12/2012 | Kim et al. | |
| 2016/0156499 | A1 * | 6/2016 | Zhang | H04L 29/10 370/476 |

* cited by examiner

*Primary Examiner* — Gail Kaplan Verbitsky
(74) *Attorney, Agent, or Firm* — Shumaker & Sieffert, P.A.

(57) ABSTRACT

A temperature sensor may include at least one cell. Each one of the at least one cell may include a bi-stable flip-flop having a first branch and a second branch. The first branch may include an asymmetry element. A processor is configured to receive, from each one of the at least one cell, an output signal indicative of an operational state of the bi-stable flip-flop and to determine a temperature based on the received output signals.

17 Claims, 7 Drawing Sheets

DETERMINING A TEMPERATURE

RELATED APPLICATIONS

The instant Application claims priority of German Patent Application No. 102014115394.4, which was filed on Oct. 22, 2014. The entire contents of the identified German Patent Application No. 102014115394.4 are hereby incorporated herein by reference.

BACKGROUND

For some applications, it can be desirable to determine a temperature. Some of these applications involve operating a chip which implements electrical circuitry.

Various techniques of determining the temperature are known. A commonly applied technique relies on measuring a so-called Proportional To Absolute Temperature (PTAT) current in a resistor. The PTAT current is typically caused by a voltage difference between two diodes operated at different current densities. In particular, in such a technique an integrated design of a respective temperature sensor with a chip including further circuitry is possible (on-chip design).

However, such techniques face certain restrictions. E.g., the accuracy in determining the temperature which is achievable by measuring the PTAT current may be comparably limited. This may be due to a limited available area to implement the required circuitry. Further, typically a minimum voltage of, e.g., 1 Volt may be required for operation. Sometimes, providing the voltage may be difficult.

To achieve a better accuracy, sometimes external sensors are employed; then, the temperature sensor may not be according to the on-chip design. External sensors are not integrated with the chip. However, due to limitations in building space, employing external sensors is often not feasible. External sensors can also be comparably costly.

SUMMARY

Various embodiments relate to a temperature sensor and to a method of determining a temperature. In particular, various embodiments relate to techniques of determining the temperature which employ a bi-stable flip-flop including a first branch and a second branch, wherein the first branch includes an asymmetry element which causes an asymmetry between the first branch and the second branch.

Some embodiments relate to techniques of determining temperature by way of temperature sensors. In some embodiments temperature sensors are implemented in an on-chip design and which allow determining the temperature at a comparably high accuracy. In some embodiments temperature sensors are implemented on a comparably small area and which allow for miniaturization. In some embodiments temperature sensors are integrated with a chip without requiring external components, i.e., which can be implemented in the on-chip design.

According to at least one embodiment, a temperature sensor is provided. The temperature sensor includes at least one cell. Each one of the at least one cell includes a bi-stable flip-flop including a first branch and a second branch. The first branch includes an asymmetry element which causes an asymmetry between the first branch and the second branch. Each one of the at least one cell further includes an interface. The interface is configured to output an output signal indicative of an operational state of the bi-stable flip-flop. The temperature sensor further includes at least one processor. The at least one processor is configured to receive, from each one of the at least one cell via the respective interface, the respective output signal in a readout event. The processor is further configured to determine a temperature based on the received output signals of a plurality of readout events.

According to at least one embodiment, a method of a temperature sensor determining a temperature is provided. The method includes for each one of at least one cell of the temperature sensor applying, at a preparation event, a supply voltage to a first branch and to a second branch of a bi-stable flip-flop of the respective cell via a supply line of the temperature sensor. The first branch of the at least one bi-stable flip-flop includes an asymmetry element which causes an asymmetry between the first branch and the second branch. The method further includes, at each one of a plurality of readout events, at least one processor of the temperature sensor receiving from a respective one of the at least one cell an output signal. The output signal is indicative of an operational state of the respective bi-stable flip-flop. The method further includes the at least one processor determining the temperature based on the received output signal of the plurality of readout events.

DETAILED DESCRIPTION

Figure 1:
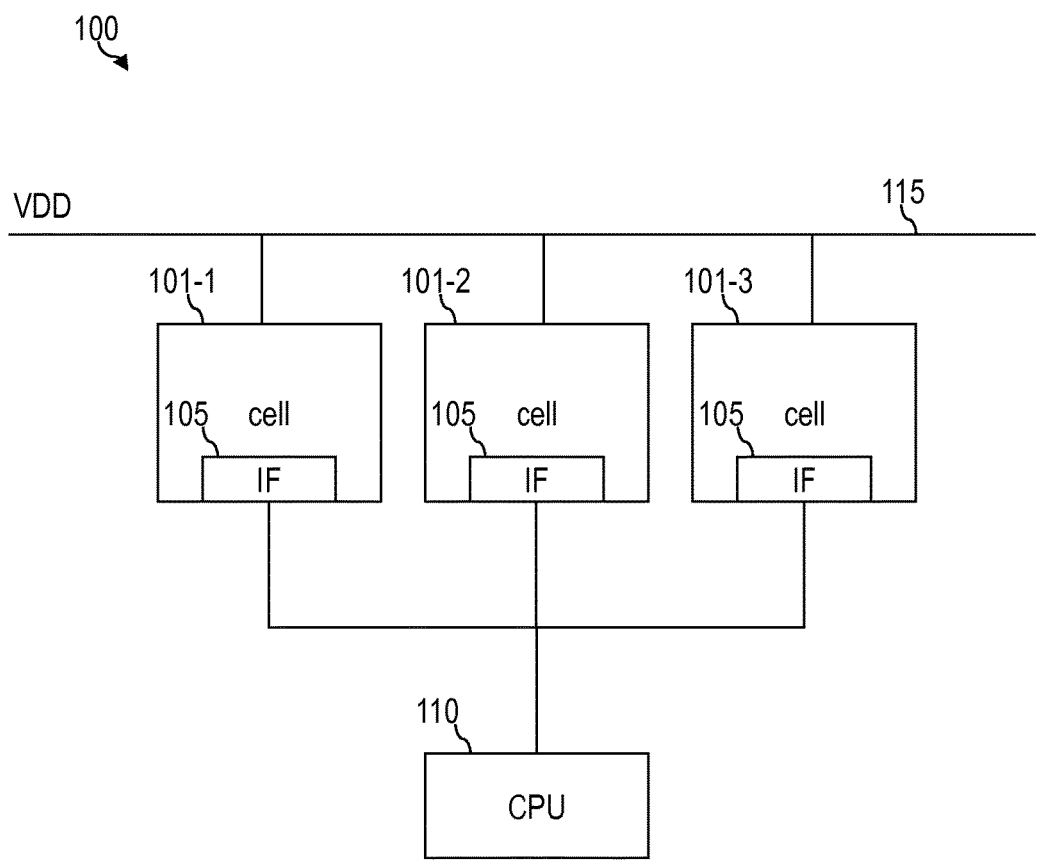
FIG. 1 schematically illustrates a temperature sensor which includes a plurality of cells according to various embodiments.

In the following, various embodiments will be described in detail referring to the attached drawings. The embodiments are to be regarded as illustrative examples only and are not to be construed as limiting. For example, while embodiments may be described as including a plurality of features or elements, in other embodiments some of these features or elements may be omitted and/or replaced by alternative features or elements. In yet other embodiments, additional features or elements may be provided.

Any connections or couplings shown in the drawings or described herein may be implemented as direct connections or couplings, i.e. connections or couplings without intervening elements, or indirect connections or couplings, i.e. connections or couplings with one or more intervening elements, as long as the general purpose of the connection or coupling, for example to transmit a certain kind of signal and/or to transmit a certain kind of information, is essentially maintained. Connections or couplings may be wire-based connections or couplings or may also be wireless connections or couplings, unless noted otherwise.

Furthermore, features from different embodiments may be combined to form additional embodiments.

Hereinafter, techniques of determining a temperature employing a temperature sensor are described. The techniques are based on a statistical approach. In various embodiments, temperature-dependent noise is evaluated using a statistical evaluation of at least one biased bi-stable flip-flop. The embodiments described herein are not limited to the use of flip-flops. For example, the embodiments may be implemented using latches or other logic devices that are not specifically flip-flops.

The biased bi-stable flip-flop has a first branch and a second branch where the first branch includes an asymmetry element as the bias. This causes an asymmetry between the first and second branches of the at least one bi-stable flip-flop.

These techniques rely on the finding that, by selectively providing the asymmetry element in the first branch of the first and second branches of the bi-stable flip-flop, the structural asymmetry caused by the asymmetry element causes an energy difference for the two operational states of the bi-stable flip-flop. Thus, also the operating states are asymmetric with respect to each other. Thermal activation energy or thermal noise causes the bi-stable flip-flop to settle at the higher energy operational state at a certain probability. This probability depends on the temperature. The statistical approach evaluates how often the bi-stable flip-flop settles at the higher energy operational state to determine the temperature.

Here, the statistics may be achieved by considering one or more readout events per bi-stable flip-flop for a plurality of flip-flops. Alternatively or additionally it is possible to achieve the statistics by considering a plurality of readout events for a single bi-stable flip-flop.

Such techniques as mentioned above allow determining the temperature at a comparably high accuracy. It is possible to shrink the area required for implementing the temperature sensor; relying on smaller fabrication technologies becomes possible. These techniques further allow implementing high accuracy sensors in silicon technology without the need for external components, i.e., allow for an on-chip design.

In FIG. 1, a temperature sensor 100 is shown. The temperature sensor 100 includes three cells 101-1, 101-2, 101-3. Each one of the three cells 101-1, 101-2, 101-3 is coupled with a common supply line 115 of the temperature sensor 115. Each one of the three cells 101-1, 101-2, 101-3 includes an interface 105 which connects the respective cell 101-1, 101-2, 101-3 to a processor 110 of the temperature sensor 100. Via the interface 105, the processor 110, at a readout event, receives an output signal from a respective one of the cells 101-1, 101-2, 101-3. E.g., the processor 110 can receive three output signals, one from each one of the cells 101-1-101-3, in three readout events. It is also possible that the processor receives six output signals, two from each one of the cells 101-1-101-3, in six readout events, etc.

While in FIG. 1 a scenario is shown where the temperature sensor 100 includes three cells 101-1, 101-2, 101-3, it is also possible that according to further embodiments the temperature sensor 100 includes a larger number or a smaller number of cells 101-1, 101-2, 101-3, e.g., a single cell.

The processor 110 is configured to determine the temperature. The temperature is the temperature of the cells 101-1, 101-2, 101-3. At thermal equilibrium, it can be assumed that the temperature is the temperature in the surrounding of the temperature sensor 100.

In particular, the processor 110 is configured to determine the temperature employing the statistics provided by a plurality of readout events. Hereinafter, techniques are explained in greater detail which enable determining the temperature. These techniques rely on each one of the cells 101-1-101-3 including a bi-stable flip-flop (not shown in FIG. 1). The bi-stable flip-flop has two operational states. The readout signal from a particular one of the cells 101-1-101-3 is indicative of the operational state of the respective bi-stable flip-flop. Based on the received output signals for the plurality of readout events, the processor 110 determines the temperature. Because the plurality of output signals indicate a plurality of operational states of the bi-stable flip-flops of the various cells 110-1-110-3, statistics on the operational states for the plurality of readout events is available. This statistics is used to determine the temperature. E.g., the processor 110 can determine the temperature based on a distribution of the operational states indicated by the output signals.

In FIG. 1, a scenario is shown where a single processor 110 is provided. However, it should be understood that, instead of relying on a single processor 110, a plurality of processors 110, e.g. multi-core processors could be implemented. Shared computing is possible.

Figure 2:
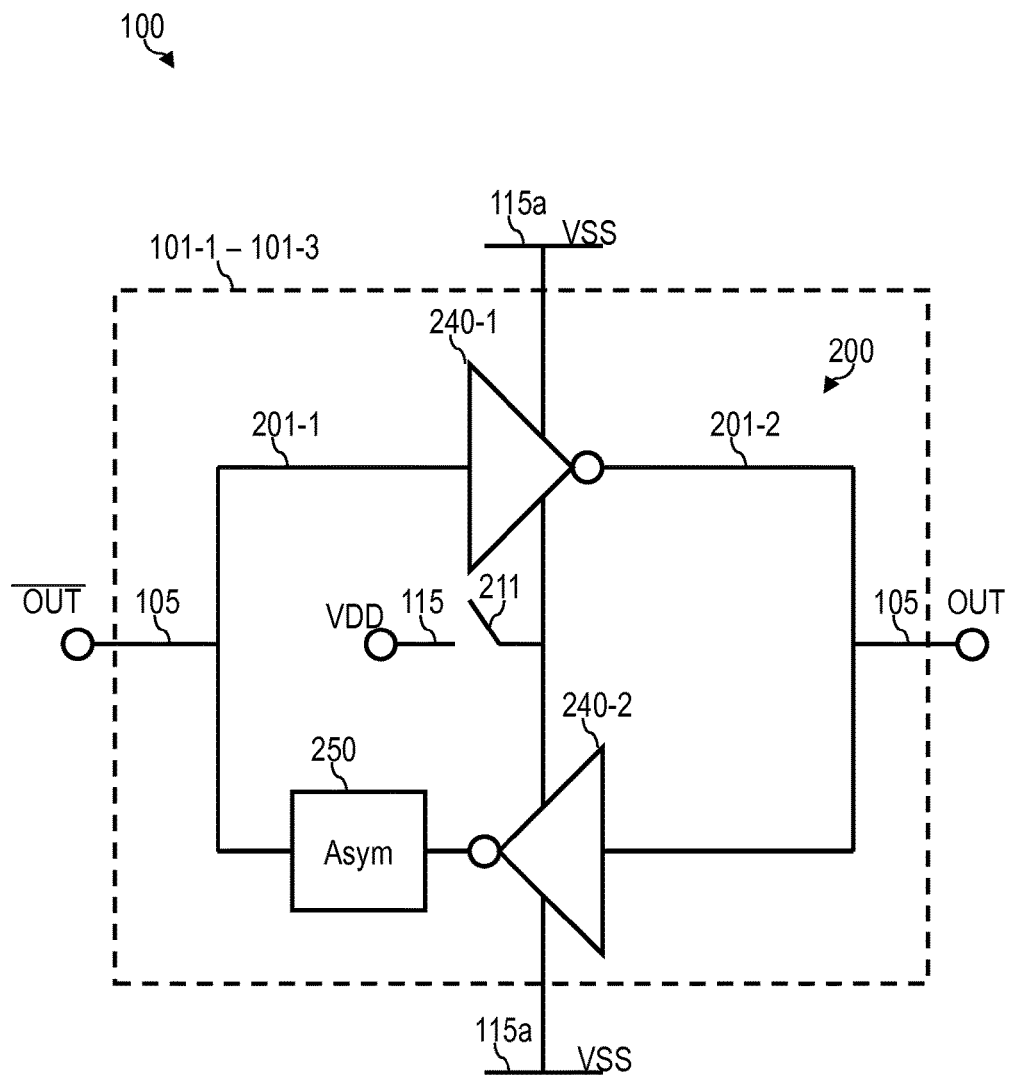
FIG. 2 schematically illustrates a cell of the temperature sensor of FIG. 1 in greater detail according to various embodiments, wherein the cell includes a bi-stable flip-flop having first and second branches.

In FIG. 2, one of the cells 101-1, 101-2, 101-3 is illustrated at greater detail. The remaining cells 101-1, 101-2, 101-3 can be implemented accordingly. As can be seen from FIG. 2, the cells 101-1, 101-2, 101-3 comprise the bi-stable flip-flop 200 having a first branch 201-1 and a second branch 201-2.

In this scenario of FIG. 2, the bi-stable flip-flop 200 is implemented by means of two inverters 240-1, 240-2. The first branch 201-1 includes the first inverter 240-1; the second branch 201-2 includes the second inverter 240-2. A switch 211 is provided which is configured to selectively couple the first branch 201-1 and the second branch 201-2 of the bi-stable flip-flop via the common supply line 115. This is done to program the cells 101-1-101-3 at a preparation event. At the preparation event, a supply voltage VDD is applied to the first branch 201-1 and to the second branch 201-2 via the supply line 115 and via the switch 211. The inverters 240-1, 240-2 are also coupled to a further common supply line 115a to which a reference voltage VSS is applied. The reference voltage VSS is typically at ground.

The first branch 201-1 includes an asymmetry element 250. The asymmetry element 250 causes an asymmetry between the first branch 201-1 and the second branch 201-2. The asymmetry is of structural kind. The asymmetry causes an energy difference between the two operational states of the bi-stable flip-flop 200. A symmetry between the two operational states is lifted.

The preparation event is symmetrically with respect to the two operational states of the bi-stable flip-flop 200. Due to the asymmetry caused by the asymmetry element 250, the bi-stable flip-flop, after the preparation event has ended and the switch 211 is controlled to be in its open position again, the bi-stable flip-flop 200 is likely to settle the particular one of the two operational states which is energetically favorably. However, due to the influence of thermal noise, the asymmetry can be overcome and, with a certain probability, the bi-stable flip-flop 200 settles in the other one of the two operational states, i.e., the particular one of the two operational states which is energetically unfavorably.

The cells 101-1, 101-2, 101-3 further comprise an interface 105. In the implementation of FIG. 2, the interface 105 includes two outputs. Via the two outputs, it is possible to read out the voltage at the first branch 201-1 and the voltage at the second branch 201-2. Each one of these voltages may define the two operational states of the bi-stable flip-flop 200. E.g., the voltages may be defined with respect to the supply voltage VDD and/or the reference voltage VSS.

In general, the interface 105 is configured to output an output signal which is indicative of the operational state of the bi-stable flip-flop 200. E.g., the interface 105 may be configured to output either the voltage in the first branch 201-1 or the voltage in the second branch 201-2.

Via the interface 105, the output signal can be received by the processor 110 (not shown in FIG. 2) in a readout event. The output signal is indicative of the operational state in which the bi-stable flip-flop 200 has settled at the time the readout event is executed.

As mentioned above, the processor 110 is configured to determine the temperature based on the received output signals of a plurality of readout events. Based on the statistics of the plurality of readout events, it is possible to determine the temperature. In particular, the processor 110 can be configured to determine the temperature based on a distribution of the operational states indicated by the output signals of the plurality of readout events. The distribution of the operational states is caused by thermal noise acting on the bi-stable flip-flop 200 at the temperature.

Figure 3:
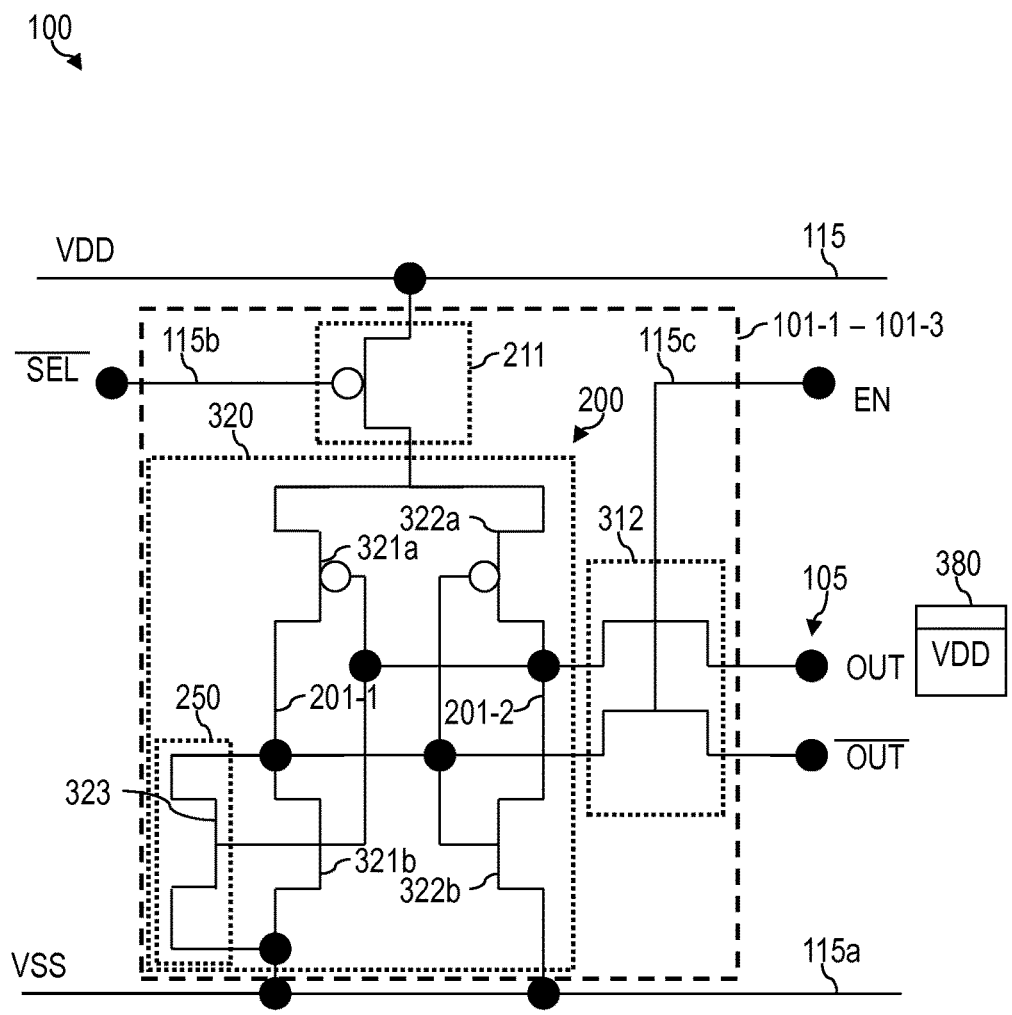
FIG. 3 schematically illustrates a cell of the temperature sensor of FIG. 1 in greater detail according to various embodiments, wherein the cell includes a bi-stable flip-flop having first and second branches.

In FIG. 3, a further implementation of the cells 101-1-101-3 is shown. The implementation of FIG. 3 is based on a static random access memory (SRAM) cell 320 which forms the bi-stable flip-flop 200. The SRAM cell 320 includes five transistors 321a, 321b, 322a, 322b, 323. The transistors 321a, 321b form the first branch 201-1 of the bi-stable flip-flop 200. The transistors 322a, 322b form the second branch 201-2 of the bi-stable flip-flop 200. As can be seen from FIG. 3, the first branch 201-1 of the bi-stable flip-flop 200 includes the asymmetry element 250 in the form of the transistor 323.

Hereinafter, details of the implementation of the scenario of FIG. 3 are illustrated. The first branch 201-1 includes a first transistor 321a being a PMOS 321a having a source, a drain, and a gate, as well as the second transistor 321b being a NMOS 321b having a source, a drain, and a gate. The second branch 201-2 of the bi-stable flip-flop 200 includes the first transistor 322a being a PMOS 322a having a source, a drain, and a gate, as well as the second transistor 322b being an NMOS 322b having a source, a drain, and a gate.

The drain of the PMOS 321a of the first branch 201-1 is coupled to the drain of the NMOS 321b of the first branch 201-1 and further coupled to the gate of the PMOS 322a of the second branch 201-2 and further coupled to the gate of the NMOS 322b of the second branch 201-2. The drain of the PMOS 322a of the second branch 201-2 is coupled to the drain of the NMOS 322b of the second branch 201-2 and further coupled to the gate of the PMOS 321a of the first branch 201-1 and further coupled to the gate of the NMOS 321b of the first branch 201-1. The asymmetry element 250, in the scenario of FIG. 3, is the transistor 323 being an NMOS 323 coupled in parallel to the NMOS 321b of the first branch 201-1. Alternatively or additionally, it is also possible that the asymmetry element 250 is a PMOS coupled in parallel to the PMOS 321a of the first branch 201-1.

The asymmetry caused by the asymmetry element 250 can be tunable. E.g., a gate width of the NMOS forming the asymmetry element 250 in the scenario of FIG. 3 can be tuned. E.g., the gate of a NMOS forming the asymmetry element 250 can amount to 0.1 to 10-times of a gate width of the NMOS 321b of the first branch 201-1 to which it is coupled in parallel.

In the scenario of FIG. 3, the two operational states of the bi-stable flip-flop 200 correspond to a voltage at one of the two ports of the interface 105 equaling either the supply voltage VDD applied via the common supply line 115 at the preparation event, or the voltage VSS at the further common supply line 115a.

In the scenario of FIG. 3, an implementation of the asymmetry element 250 in the form of the NMOS coupled in parallel to the NMOS 321b has been shown. In general, various implementations of the asymmetry element 250 are conceivable. E.g., the asymmetry element may be a transistor; a current source; a field-effect transistor; an Ohmic resistance; and/or an inductance.

Figure 4:
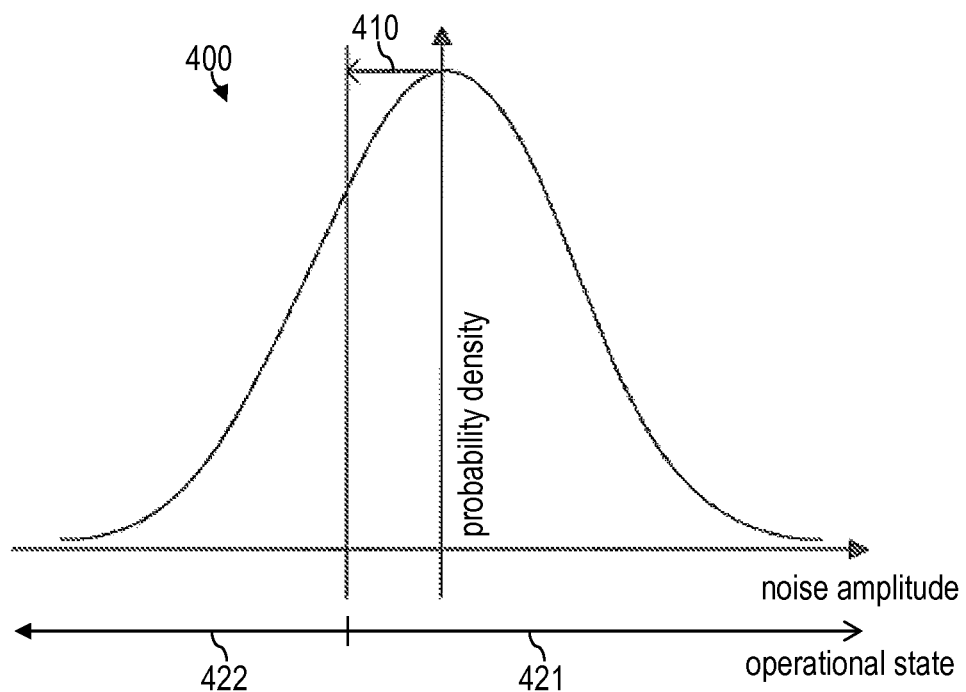
FIG. 4 illustrates schematically determining of a temperature employing thermal noise according to various embodiments, wherein a distribution of operating states of the bi-stable flip-flops for a given temperature is shown.

Above, techniques of implementing the temperature sensor 100 have been primarily discussed. Hereinafter, the underlying concepts of determining the temperature are illustrated in greater detail. In FIG. 4, the Gaussian probability density function of thermal noise is shown. This distribution defines the probability of the final operational states 421, 422.

As mentioned above, the asymmetry element 250 causes an asymmetry 410 in terms of energy between the operational states 421, 422. This asymmetry 410 caused by the asymmetry element 250 is schematically illustrated in FIG. 4. The thermal noise or thermal activation energy causes a non-zero probability for the bi-stable flip-flop 200 to be, at the readout event, in the second operation state 422. Due to the asymmetry 410, a probability (the area underneath the curve right of the zero-axis in FIG. 4) for the bi-stable flip-flop 200 to be in a first operational state 421 is larger than the probability for the bi-stable flip-flop 200 to be in the second operational state 422. This is because the center of the distribution 400 is shifted against the transition from the first operational state 421 to the second operational state 422.

Figure 5:
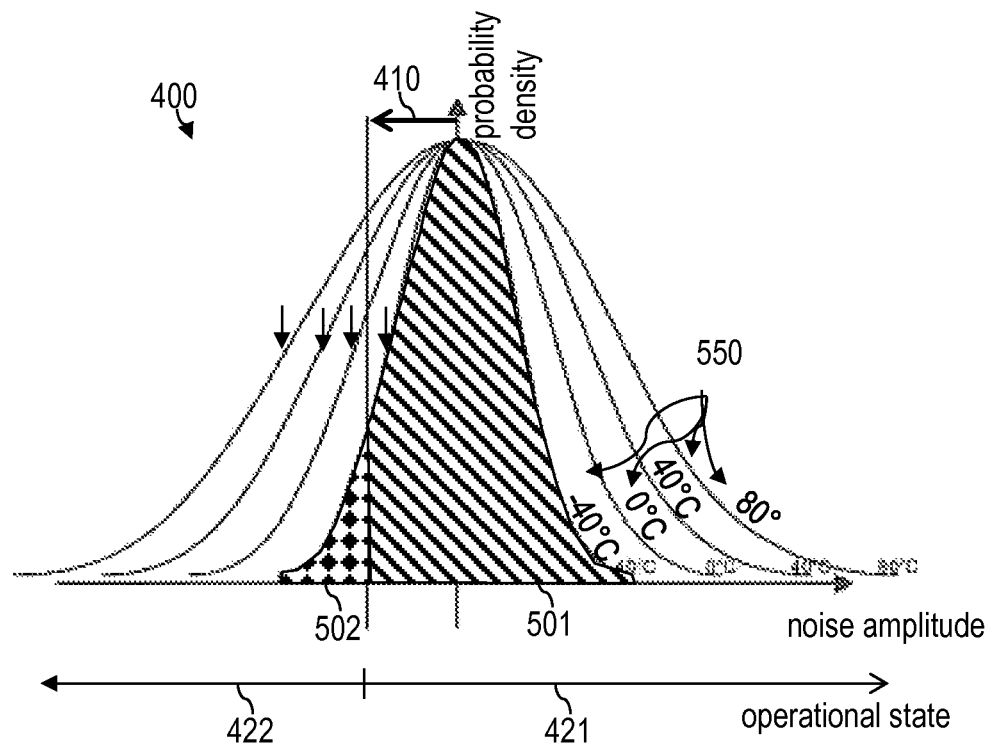
FIG. 5 illustrates schematically determining of the temperature employing thermal noise according to various embodiments, wherein a distribution of operating states of the bi-stable flip-flops for various temperatures are shown.

The full-width at half maximum (FWHM) of the distribution 400 depends on the temperature 500, see FIG. 5. The larger (smaller) the temperature 550, the larger (smaller) the thermal noise, the larger (smaller) the FWHM of the distribution 400. This finding can be exploited when determining the temperature 550.

In FIG. 5, multiple distributions 400 are exemplarily shown for four temperatures 550, namely −40° C., 0° C., 40° C. and 80° C. For the temperature 550 amounting to −40° C., the probability 501 of the bi-stable flip-flop 200 being in the first operational state 421 at the readout event is illustrated in FIG. 5 (shown by the diagonally dashed area in FIG. 5). Further, the probability 502 of the bi-stable flip-flop 200 being in the second operational state 422 is shown for this temperature 550 of −40° C. (shown by the dotted area in FIG. 5). The two probabilities 501, 502 typically sum up to 1. As can be seen from FIG. 5, for higher (lower) temperatures 540, the probability of 502 of the bi-stable flip-flop 200 being in the second operational state 421 at the readout event is lower (higher). Thus, by counting the number of readout events which correspond to the bi-stable flip-flop 200 to be in the first operational state 421, it is possible to determine the temperature.

Figure 6:
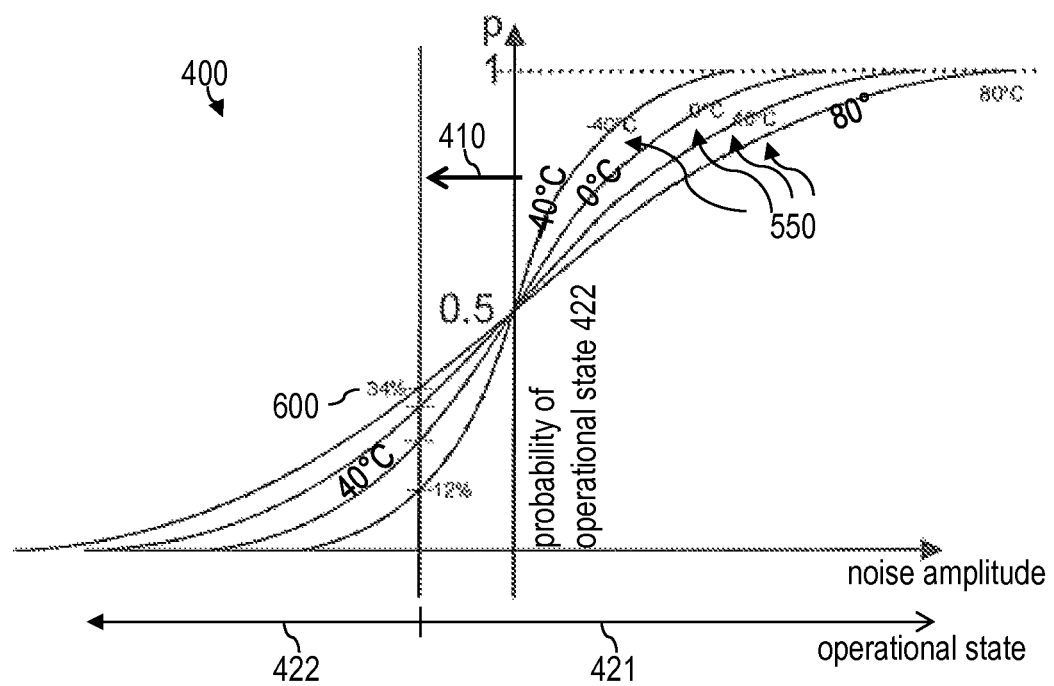
FIG. 6 illustrates schematically determining of the temperature employing thermal noise according to various embodiments, wherein in FIG. 6 density functions of the distributions of FIG. 5 are shown.

This is also illustrated in FIG. 6. FIG. 6 is a cumulative distribution function (CDF) plot of the distributions 400 of FIG. 5. FIG. 6 thus corresponds to an integral over the distributions 400 of FIG. 5. In FIG. 6, a number 600 of flip-flops being in the second operational state is shown for the various temperatures 540. For example, for the temperature of −40° C., 12% of the output signals of the plurality of readout events indicate the bi-stable flip-flop 200 being in the second operational state 422. In contrast, at a temperature of 80° C., 34% of the output signals of the plurality of readout events will indicate the bi-stable flip-flop 200 being in the second operational state 422.

It is possible that the processor 110 determines the number 600 of output signals 380 which correspond to the same operational state 421, 422 of the bi-stable flip-flop 200. The temperature sensor 100 can comprise a memory which is configured to store a look-up table. The look-up table can include a plurality of links between a candidate number of output signals 380 which correspond to the same operational state 421, 422 of the bi-stable flip-flop 200 and an associated temperature 540. The processor 110 can then be configured to determine the temperature 550 by executing a look-up of the determined number 600 of output signals 380 which correspond to the same operational state 421, 422 of the bi-stable flip-flop 200 in the plurality of links of the look-up table.

It is possible to increase the accuracy of the determining of the temperature 550 by appropriately dimensioning the asymmetry 410; this may be achieved by choosing an appropriate asymmetry element 250 or by appropriately setting properties of the asymmetry element 250, e.g., a channel width if the asymmetry element 250 is implemented as a transistor. It is also possible to dynamically dimension the asymmetry 410. This may be achieved, e.g., by provisioning a plurality of asymmetry elements 250 in parallel and selectively activating some or all of the asymmetry elements 250.

It is possible to dimension the asymmetry 410 depending on a temperature range. The asymmetry 410 may be set such that in the temperature range an increased sensitivity and/or accuracy is achieved.

As can be seen from FIG. 6, a difference between the number 600 of bi-stable flip-flops 200 in the first and second operational states 421, 422 for the temperatures of −40° C. and 0° is larger than for the temperatures of +40° and 80° C. (in FIG. 6, the corresponding density functions have a smaller distances at +40° C. and +80° C. than at −40° C. and 0° C.) Thus, the respective temperature sensor 200 which implements an asymmetry element 250 giving the asymmetry 410 of the scenario of FIG. 6 shows a higher sensitivity and therefore a higher accuracy for temperatures 550 in the range of −40° C. . . . 0° C. than for temperatures 550 in the range of +40° C. . . . 80° C.

A similar finding may be explained with reference to FIG. 5. In FIG. 5, points for the distributions 400 where a derivative of the distribution 400 takes a maximum are indicated with vertical arrows. To achieve a maximum sensitivity when determining the temperature 500, it can be desirable to dimension the asymmetry element 250 such that the asymmetry 410 corresponds to these points.

In general, it is possible that the temperature sensor 100 includes different subset of cells 101-1-101-3 which are optimized with respect to different temperature ranges. E.g., the temperature sensor 100 can comprise a plurality of cells 101-1, 101-2, 101-3, wherein the plurality of cells 101-1, 101-2, 101-3 includes a first subset of cells and a second subset of cells. The asymmetry elements 250 of the cells 101-1-101-3 of the first subset of cells 101-1-101-3 can cause the asymmetry 410 to have a first value. The asymmetry elements 250 of the cells 101-1-101-3 of the second subset of cells 101-1-101-3 can cause the asymmetry 410 to have a second value. The first value can be different from the second value. The processor 110 can then be configured to determine the temperature 550 selectively based on output signals 380 from either the first subset of cells 101-1-101-3 or the second subset of cells 101-1-101-3 depending on a pre-selected temperature range.

In a similar manner it is possible to dynamically dimension the asymmetry 410 of the asymmetry element 250 depending on the pre-selected temperature range. E.g., a larger or smaller number of a plurality of asymmetry elements 250 may be activated.

Figure 7:
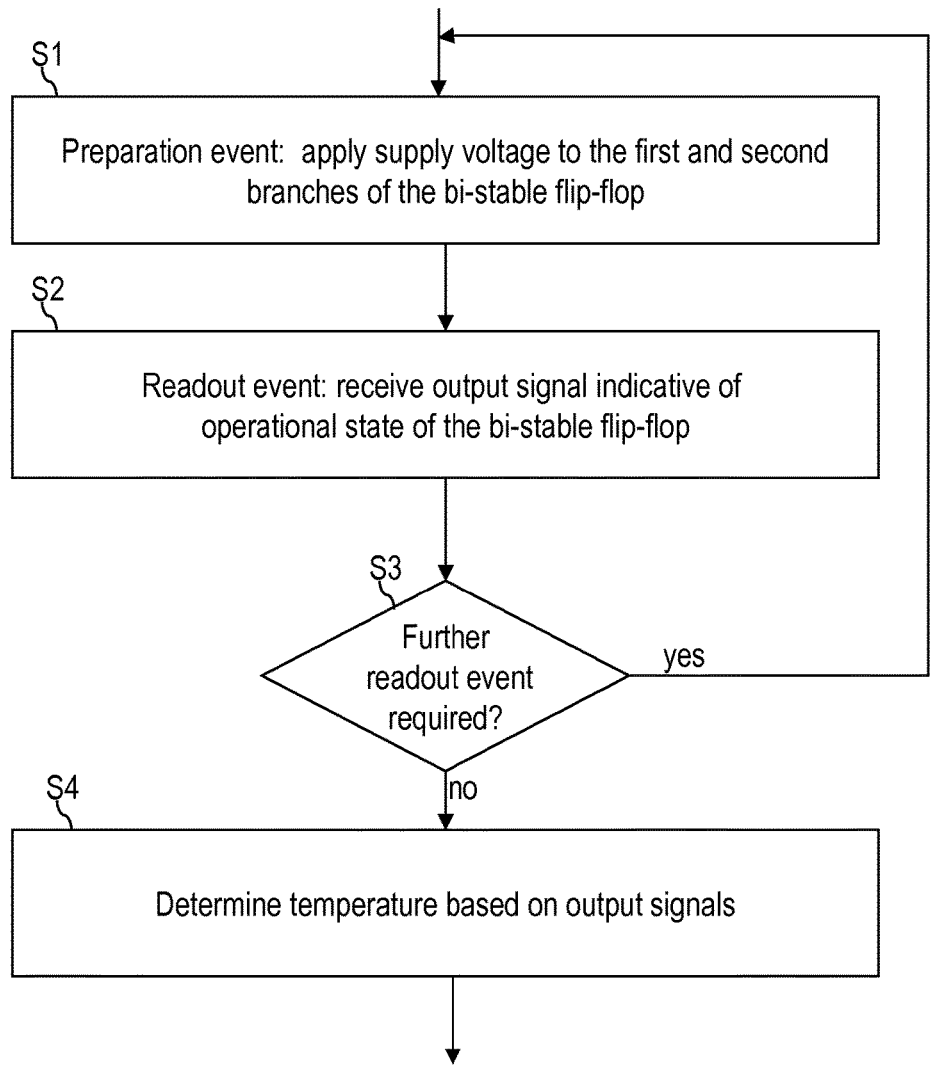
FIG. 7 is a flowchart of a method of determining the temperature according to various embodiments.

In FIG. 7, a flowchart of a method according to various embodiments is illustrated. At S1, a preparation event occurs. Here, the supply voltage VDD is applied to the first and second branches 201-1-201-2 of the bi-stable flip-flop 200 of a particular cell 101-1-101-3. For this, it is possible to control the switch 211 to be in a closed position, e.g., for a pre-defined duration.

Next, S2 is executed. S2 can be executed at a pre-defined time after S1 has been executed. This allows the bi-stable flip-flop 200 to settle in one of the two operational states 421, 422. At S2, a readout event of the bi-stable flip-flop 200 which has been prepared at S1 occurs. At S2, the output signal 380 is received by the processor 110. The output signal 380 is indicative of the operational state 421, 422 of the bi-stable flip-flop 200. E.g., the bi-stable flip-flop 200 may be implemented as the SRAM cell 320 (cf. FIG. 3). The output signal 380 can be a voltage which corresponds to either the supply voltage VDD applied to the common supply line 150 or the voltage VSS applied to the further common supply line 150a.

At S3, it is checked whether a further readout event is required. At S3, it can be checked whether sufficient statistics is available to determine the temperature with a sufficient accuracy. Typically, if a larger (smaller) number of readout events is considered when determining the temperature 550, the accuracy of the determined temperature 550 is larger (smaller).

If, at S3, it is determined that a further readout event is required, S1 and S2 are executed anew. Here it is possible that the preparation event and the readout event of S1 and S2 relate to the same bi-stable flip-flop 200 which has been used to obtain the output signal in the first iteration of S1 and S2. However, it is also possible that S1 and S2 are executed anew employing a further bi-stable flip-flop 200 of another cell 101-1-101-3 of the temperature sensor 100.

In general, it is also possible that S1 and S2 are executed at least partly in parallel for a plurality of bi-stable flip-flops 200 of various cells 101-1-101-3 of the temperature sensor 100. In such a manner, it is possible to reduce a measurement time required for determining the temperature 550. Further, as the statistical evaluation relies on a larger amount of readout events, the accuracy of the determining of the temperature 550 can be increased.

If, at S3, it is determined that no further readout event is required, at S4 the temperature 550 is determined based on the received output signals. The determining of the temperature 550 can consider the number 600 of readout events which indicate that the respective bi-stable flip-flop 200 is in a particular one of the operational states 421, 422. A look-up table linking the number 600 with the temperature 550 may be employed at S4.

Figure 8:
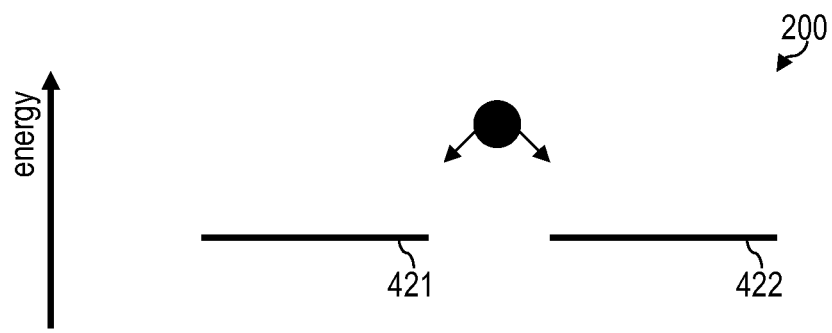
FIG. 8 illustrates schematically two operating states of the bi-stable flip-flop where no asymmetry between first and second branches of the bi-stable flip-flop is present.
Figure 9:
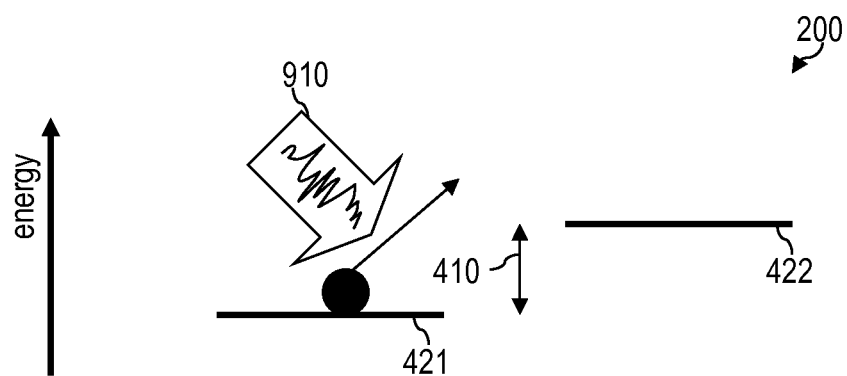
FIG. 9 illustrates schematically the two operating states of the bi-stable flip-flop where an asymmetry between first and second branches of the bi-stable flip-flop is present, wherein FIG. 9 further illustrates the thermal noise.

In FIGS. 8 and 9 the concept of employing thermal noise 910 to determine the temperature 550 is schematically illustrated. In FIG. 8, an energy level of the two operational states 421, 422 of the bi-stable flip-flop 200 is equal. This is because there is no asymmetry element 250 which causes the asymmetry 410. Thus, the bi-stable flip-flop is equally likely to settle in the first operational state 421 as in the second operational state 422.s In FIG. 9, the asymmetry element 250 causes the asymmetry 410. The second operational state 422 is associated with a higher energy, i.e., it is energetically less favourable. In such a scenario, at absolute zero temperature the bi-stable flip-flop 200 would always settle at the first operational state 421. Yet, at finite temperatures 550, thermal noise or thermal activation energy 910 causes a non-zero probability for the bi-stable flip-flop 200 to settle in the second operational state 422. Higher temperatures 550 correspond to higher thermal activation energy 910. The bi-stable flip-flop 200 is less stable. Then, to achieve a sufficient accuracy, the asymmetry element 250 should be dimensioned to cause a larger asymmetry 410.

Above, techniques of implementing a temperature sensor based on a statistical evaluation of a plurality of readout events of a bi-stable flip-flop having an asymmetry element in one branch has been shown. Various applications may benefit from such a temperature sensor. E.g., it is possible to implement a clinical thermometer having a sensitivity range of 35° C. to 44° C. It also possible to implement a security sensor which has a first sensitivity range at around −20° C. and a second sensitivity range at around 80° C. For example, in the last mentioned example, it is possible that the temperature sensor employs two subsets of bi-stable flip flops which have differently dimensioned asymmetry elements such that, for both temperature ranges, a comparably high accuracy may be achieved.

Although the implementations have been shown and described with respect to certain preferred embodiments, equivalents and modifications will occur to others skilled in the art upon the reading and understanding of the specification.

In the above, primarily scenarios have been discussed where the bi-stable flip-flop has only two operational states. It is likewise possible to employ bi-stable flip-flops which have more than two operational states. Here, depending on the dimension of the asymmetry between the various operational states, the energy difference changes; this may be employed to determine the temperature.

The invention claimed is:

1. A temperature sensor, comprising:
   at least one cell, the at least one cell comprising:
      a bi-stable flip-flop comprising a first branch and a second branch, wherein the first branch comprises an asymmetry element which causes an asymmetry between the first branch and the second branch,
      an interface configured to output an output signal indicative of an operational state of the bi-stable flip-flop,
   the temperature sensor further comprising:
   at least one processor configured to receive, from the at least one cell via the interface, the output signal in a readout event,
   wherein the processor is further configured to:
      determine a temperature of a region surrounding the temperature sensor based on the received output signal, and
      output the determined temperature for a predetermined sensitivity range.

2. The temperature sensor of claim 1,
   wherein the processor is configured to determine the temperature based on a distribution of operational states of the bi-stable flip-flop indicated by a plurality of readout events associated with output signals.

3. The temperature sensor of claim 2, wherein the distribution of the operational states is caused by thermal noise acting on the bi-stable flip-flop at the temperature.

4. The temperature sensor of claim 2, wherein the plurality of readout events relate to at least one of multiple readout events for the at least one cell.

5. The temperature sensor of claim 1,
   wherein the processor is configured to determine, based on received output signals of a plurality of readout events, a number of output signals which correspond to a same operational state of the bi-stable flip-flop,
   wherein the temperature sensor further comprises a memory configured to store a look-up table, the look-up table including a plurality of links between a candidate number of output signals which correspond to the same operational state and an associated temperature,
   wherein the processor is configured to determine the temperature by executing a lookup for the determined number of output signals which correspond to the same operational state in the plurality of links of the look-up table.

6. The temperature sensor of claim 1,
   wherein the temperatures sensor further comprises a supply line,
   wherein the operational state relates to a voltage difference between at least one of the first branch and the second branch and a supply voltage applied to the supply line.

7. The temperature sensor of claim 1,
   wherein the first branch of the bi-stable flip-flop comprises:
      a PMOS having a source, a drain, and a gate;
      a NMOS having a source, a drain, and a gate;
   wherein the second branch of the bi-stable flipflop comprises:
      a PMOS having a source, a drain, and a gate;
      a NMOS having a source, a drain, and a gate;
   wherein the drain of the PMOS of the first branch is coupled to the drain of the NMOS of the first branch and further coupled to the gate of the PMOS of the second branch and further coupled to the gate of the NMOS of the second branch,
   wherein the drain of the PMOS of the second branch is coupled to the drain of the NMOS of the second branch and further coupled to the gate of the PMOS of the first branch and further coupled to the gate of the NMOS of the first branch.

8. The temperature sensor of claim 7,
   wherein the asymmetry element is at least one of a second NMOS coupled in parallel to the NMOS of the first branch and a second PMOS coupled in parallel of the PMOS of the first branch.

9. The temperature sensor of claim 8,
   wherein a gate width of the second NMOS and/or the second PMOS amounts to 0.1 to 10-times of a gate width of the NMOS and/or the PMOS of the first branch of the bi-stable flip-flop to which it is coupled in parallel.

10. The temperature sensor of claim 1, wherein the asymmetry element is one of: a transistor; a current source; a field-effect transistor; an Ohmic resistance; or an inductance.

11. The temperature sensor of claim 1, wherein the at least one cell comprises:
a switch configured to selectively couple the first branch and the second branch of the respective bi-stable flip-flop with a supply line to program the respective cell at a preparation event; and/or
a further switch configured to selectively couple at least one of the first branch and the second branch with the interface to output the output signal at the readout event; and
wherein the at least one cell is a plurality of cells.

12. The temperature sensor of claim 1,
wherein the temperature sensor comprises a plurality of cells,
wherein the plurality of cells comprises a first subset of cells and a second subset of cells,
wherein the asymmetry elements of the plurality of cells of the first subset of cells cause the asymmetry to have a first value,
wherein the asymmetry elements of the plurality of cells of the second subset of cells cause the asymmetry to have a second value,
wherein the first value is different from the second value,
wherein the processor is configured to determine the temperature selectively based on output signals from either the first subset of cells or the second subset of cells depending on a preselected temperature range.

13. A method of a temperature sensor determining a temperature, the method comprising:
for at least one cell of the temperature sensor, at a preparation event, applying a supply voltage to a first branch and to a second branch of a bi-stable flip-flop of the at least one cell via a supply line of the temperature sensor,
wherein the first branch of the at least one bi-stable flip-flop comprises an asymmetry element which causes an asymmetry between the first branch and the second branch,
receiving, by at least one processor of the temperature sensor and from the at least one cell, via an interface of the cell, an output signal indicative of an operational state of the bi-stable flip-flop,
determining, by the at least one processor, the temperature of a region surrounding the temperature sensor based on the received output signals of a plurality of readout events, and
outputting by the at least one processor, the determined temperature for a predetermined sensitivity range.

14. The method of claim 13, wherein the determining of the temperature is based on a distribution of the operational states of the bi-stable flip-flop indicated by output signals.

15. The method of claim 13, wherein the plurality of readout events relate to at least one of multiple readout events for the at least one cell and multiple readout events for a plurality of cells.

16. The method of claim 15, further comprising:
the at least one processor determining, based on the received output signals of the plurality of readout events, a number of output signals which correspond to a same operational state of the bi-stable flip-flop,
retrieving, from a memory of the temperature sensor, a look-up table, the look-up table including a plurality of links between a candidate number of output signals which correspond to the same operational state and an associated temperature,
wherein the determining of the temperature includes executing a lookup for the determined number of output signals which correspond to the same operational state in the plurality of links of the look-up table.

17. The method of claim 13, wherein the method is executed by a temperature sensor according to claim 1.

* * * * *